(12) United States Patent
Hasegawa et al.

(10) Patent No.: US 8,194,711 B2
(45) Date of Patent: Jun. 5, 2012

(54) NITRIDE SEMICONDUCTOR LASER DEVICE

(75) Inventors: Yoshiaki Hasegawa, Okayama (JP); Atsunori Mochida, Osaka (JP)

(73) Assignee: Panasonic Corporation, Osaka (JP)

( * ) Notice: Subject to any disclaimer, the term of this patent is extended or adjusted under 35 U.S.C. 154(b) by 76 days.

(21) Appl. No.: 12/470,919

(22) Filed: May 22, 2009

(65) Prior Publication Data

US 2010/0014550 A1    Jan. 21, 2010

(30) Foreign Application Priority Data

Jul. 18, 2008 (JP) .................................. 2008-187681

(51) Int. Cl.
*H01S 5/00* (2006.01)

(52) U.S. Cl. .................................. 372/49.01; 372/43.01

(58) Field of Classification Search .................. 372/49.01
See application file for complete search history.

(56) References Cited

U.S. PATENT DOCUMENTS

| | | | |
|---|---|---|---|
| 2004/0228382 A1* | 11/2004 | Oshima ............................ | 372/49 |
| 2006/0133442 A1 | 6/2006 | Kondou et al. | |
| 2007/0014323 A1* | 1/2007 | Tachibana et al. ......... | 372/46.01 |
| 2007/0080368 A1 | 4/2007 | Kamikawa et al. | |
| 2007/0177646 A1* | 8/2007 | Sogabe et al. ............. | 372/49.01 |
| 2007/0211776 A1 | 9/2007 | Yoshida et al. | |
| 2007/0246720 A1 | 10/2007 | Kamikawa et al. | |
| 2008/0181275 A1 | 7/2008 | Matsuyama et al. | |
| 2008/0205468 A1* | 8/2008 | Kawasaki et al. .......... | 372/49.01 |
| 2009/0086778 A1 | 4/2009 | Kameyama et al. | |

FOREIGN PATENT DOCUMENTS

| | | |
|---|---|---|
| JP | 09-194204 | 7/1997 |
| JP | 2007-081197 | 3/2007 |
| JP | 2007-103814 | 4/2007 |
| JP | 2007-318088 | 12/2007 |
| JP | 2007-324193 | 12/2007 |
| JP | 2008-016685 A | 1/2008 |
| JP | 2008-103407 A | 5/2008 |
| JP | 2008-270498 | 11/2008 |

* cited by examiner

*Primary Examiner* — Jessica Stultz
*Assistant Examiner* — Xnning Niu
(74) *Attorney, Agent, or Firm* — McDermott Will & Emery LLP (57) ABSTRACT

A nitride semiconductor laser device includes a multilayer structure including a plurality of nitride semiconductor layers including a light emitting layer, the multilayer structure having cavity facets facing each other, and a plurality of protective films made of a dielectric material provided on one of the cavity facets. The protective films include a first protective film, a second protective film and a third protective film. The first protective film contacts the cavity facet and is made of aluminum nitride. The second protective film is provided on a surface opposite to the cavity facet of the first protective film and is made of a material different from that of the first protective film. The third protective film is provided on a surface opposite to the first protective film of the second protective film and is made of the same material as that of the first protective film.

4 Claims, 4 Drawing Sheets

NITRIDE SEMICONDUCTOR LASER DEVICE

CROSS REFERENCE TO RELATED APPLICATIONS

This application claims priority under 35 U.S.C. §119(a) on Patent Application No. 2008-187681 filed in Japan on Jul. 18, 2008, the entire contents of which are hereby incorporated by reference.

BACKGROUND

The present disclosure relates to a nitride semiconductor laser device, and more particularly, to a nitride semiconductor laser device in which a protective film is provided on a cavity facet.

In recent years, there is an increasing demand for a semiconductor laser device having higher power. A technique of imparting light resistance to such a semiconductor laser device is a key factor to secure the performance of the device.

For example, a blue-violet semiconductor laser device made of a group III-V nitride semiconductor material ($Al_x Ga_y In_{1-x-y} N$ (note that $0 \leq x \leq 1$, $0 \leq y \leq 1$, $0 \leq x+y \leq 1$)), such as gallium nitride (GaN) or the like, is a major device for achieving ultra-high density recording of an optical disc apparatus, and is currently reaching a level at which it can be put into practical use. The higher-power blue-violet semiconductor laser device not only allows high-speed writing of an optical disc, but also is essential to develop a new technical field, such as application to a laser display device or the like.

Recent infrared and red semiconductor laser devices made of a gallium arsenide (GaAs)-based semiconductor material have a facet window structure in which an impurity is selectively diffused into an active layer in the vicinity of a cavity facet. As a result, the forbidden band (band gap energy) of the active layer is expanded only in the vicinity of the facet, thereby reducing light absorption and heat generation at the cavity facet. Such devices achieve higher power and higher reliability.

On the other hand, for GaN-based semiconductor materials, since it is not easy to form a facet window structure by impurity diffusion, it is considerably important to provide a facet protective film (coating film) made of a dielectric material which is formed on the cavity facet.

The facet protective film may be formed in a semiconductor laser device by depositing aluminum nitride (AlN) using an Electron Cyclotron Resonance (ECR) sputtering device, which causes less damage on the facet (see, for example, Japanese Unexamined Patent Application Publication No. H09-194204 (hereinafter referred to as Document 1)).

In a GaN-based semiconductor laser device, a first protective film made of AlN contacting the facet, and a second protective film made of aluminum oxide ($Al_2O_3$) following the first protective film may be provided so as to suppress oxidation of the GaN facet, thereby preventing a deterioration in the facet (see, for example, Japanese Unexamined Patent Application Publication No. 2007-103814 (hereinafter referred to as Document 2)).

In a GaN-based semiconductor laser device, a first protective film made of AlN or aluminum oxynitride (AlON) contacting the cavity facet, and a second protective film which is a reflectance adjusting layer made of an oxide may be provided so as to maintain a high Catastrophic Optical Damage (COD) level and increase the reflectance of the light emitting facet (see, for example, Japanese Unexamined Patent Application Publication No. 2007-318088 (hereinafter referred to as Document 3)).

Moreover, in a GaN-based semiconductor laser device, the facet protective film may include a moisture absorption preventing layer (silicon nitride/titanium nitride) so as to suppress diffusion of moisture from ambient air, thereby preventing a deterioration in the facet (see, for example, Japanese Unexamined Patent Application Publication No. 2007-324193 (hereinafter referred to as Document 4)).

SUMMARY

In order to cause a GaN-based semiconductor laser device to stably operate while outputting high-power laser, it is necessary to form a stable facet protective film which can suppress oxidation of a cavity facet and resist high-power light.

The present inventors have diligently studied on a facet protective film to find that prevention of oxidation of a cavity facet during formation of the facet protective film to the extent possible, and moreover, suppression of oxidation of the facet due to diffusion of oxygen generated during an operation of a semiconductor laser device, significantly contribute to achievement of a stable high-power operation, and are therefore considerably important to achieve higher reliability.

Although Document 1 describes that a protective film made of AlN is formed as a first protective film contacting a cavity facet using the ECR apparatus, Document 1 does not particularly suggest an arrangement of additional films following the first protective film.

In the conventional techniques described in Documents 2 and 3, a first protective film contacting a cavity facet is made of an AlN film so as to be prevented from being altered due to heat generated at the facet. However, since a second protective film following the first protective film is made of an $Al_2O_3$ film, the second protective film is locally altered due to a high-power operation. As a result, alteration of a facet reflectance and mutual diffusion of component atoms between the first and second protective films are promoted, so that a laser operation becomes unstable, which accelerates deterioration.

In the conventional technique described in Document 4, a moisture absorption preventing layer is made of SiN/TiN, which is a nitride film different from aluminum nitride (AlN). Therefore, it is likely that the heat dissipating capability becomes worse, leading to a deterioration in a protective film and a cavity facet.

In view of the aforementioned conventional problems, an object of the present disclosure is to provide a nitride semiconductor laser device having long-term reliability during a high-power operation.

To achieve the object, the present disclosure provides a nitride semiconductor laser device including two facet protective films made of aluminum nitride, and a film made of a dielectric material different from aluminum nitride which is provided between the two facet protective films.

Specifically, a first nitride semiconductor laser device according to the present disclosure includes a multilayer structure including a plurality of nitride semiconductor layers including a light emitting layer, the multilayer structure having cavity facets facing each other, and a plurality of protective films made of a dielectric material provided on one of the cavity facets. The plurality of protective films include a first protective film, a second protective film and a third protective film. The first protective film contacts the cavity facet and is made of aluminum nitride. The second protective film is provided on a surface opposite to the cavity facet of the first protective film and is made of a material different from that of the first protective film. The third protective film is provided on a surface opposite to the first protective film of the second protective film and is made of the same material as that of the first protective film.

According to the first nitride semiconductor laser device, the second protective film made of a material different from AlN sandwiched between the aluminum nitride (AlN) films having higher thermal conductivity, can quickly dissipate locally generated heat. Therefore, an alteration does not occur in the second protective film. As a result, long-term reliability during a high-power operation can be obtained.

In the first nitride semiconductor laser device, the first and third protective films preferably contain silicon. The first protective film preferably has a higher silicon concentration than that of the third protective film.

In the first nitride semiconductor laser device, the plurality of protective films preferably include a fourth protective film provided on a surface opposite to the second protective film of the third protective film. The fourth protective film is preferably made of aluminum oxide or aluminum oxynitride.

In the first nitride semiconductor laser device, the plurality of protective films preferably include a fifth protective film provided on a surface opposite to the third protective film of the fourth protective film. The fifth protective film is preferably made of the same material as that of the first protective film.

In the first nitride semiconductor laser device, the second protective film is preferably made of aluminum oxide, aluminum oxynitride, silicon oxide or silicon oxynitride.

A second nitride semiconductor laser device according to the present disclosure includes a multilayer structure including a plurality of nitride semiconductor layers including a light emitting layer, the multilayer structure having cavity facets facing each other, and three or more protective films made of a dielectric material provided on one of the cavity facets. The three or more protective films include a first protective film and a second protective film. The first protective film contacts the cavity facet and is made of aluminum nitride. The second protective film is an outermost protective film contacting ambient air and is made of aluminum nitride.

According to the second nitride semiconductor laser device, the other protective film(s) made of a material different from AlN sandwiched between the aluminum nitride (AlN) films having higher thermal conductivity, can quickly dissipate locally generated heat. Therefore, an alteration does not occur in the other protective film(s). As a result, long-term reliability during a high-power operation can be obtained.

As described above, according to the nitride semiconductor laser devices of the present disclosure, long-term reliability during a high-power operation can be significantly improved.

DETAILED DESCRIPTION

The present inventors have diligently studied on a nitride semiconductor laser device which particularly secures long-term reliability during a high-power operation even when the device is mass-produced. As a result, the present inventors have found that the long-term reliability can be achieved by preventing oxidation of a cavity facet of the laser device during formation of a facet protective film to the extent possible, and by suppressing oxidation of the facet due to diffusion of oxygen generated during an operation of the laser device as described above, and have achieved the present disclosure.

Hereinafter, an overview of a method for fabricating an example nitride semiconductor laser device will be described.

Initially, a multilayer structure made of a nitride semiconductor is formed on a main surface (e.g., a Ga surface) of a substrate made of a nitride semiconductor by a known semiconductor growth method employing an epitaxial growth technique.

The multilayer structure includes a p-type region and an n-type region. Moreover, the multilayer structure forming a semiconductor laser device includes a double-heterostructure and a structure which confines light and current within a predetermined space.

A positive electrode which is electrically connected to the p-type region of the multilayer structure is formed on the main surface of the substrate, and a negative electrode is formed on a rear surface of the substrate.

In a preferable embodiment, the positive electrode includes a contact electrode having a portion contacting the p-type region of the multilayer structure, and a wiring electrode for supplying a current to the contact electrode. An insulating film is formed on the multilayer structure so that the contact electrode partially contacts the p-type region. Therefore, a current is confined by the insulating film before being injected into the multilayer structure, thereby increasing the current density of the injected current. As a result, laser oscillation is more easily generated.

Generation of laser oscillation requires a cavity for amplifying light. For example, the multilayer structure including the substrate is cleaved to form cavity facets facing each other.

In a preferable embodiment, the cavity facet is covered with a protective film made of a dielectric material, thereby making it possible to prevent the cavity facet from being exposed to ambient air, and arbitrary adjust a reflectance of the facet.

Experiments conducted by the present inventors have demonstrated that if the aforementioned structure includes a first protective film which contacts the cavity facet and is made of aluminum nitride (AlN), a second protective film which is formed on the first protective film and is made of aluminum oxide ($Al_2O_3$), aluminum oxynitride (AlON), silicon dioxide ($SiO_2$) or silicon oxynitride (SiON), and a third protective film which follows the second protective film and is made of AlN, which is the same as that of the first protective film, the oxidation of the cavity facet is significantly suppressed, so that a deterioration in the facet can be prevented.

With the aforementioned structure, the yield of a GaN-based semiconductor laser device which ensures high-power operation for a long period of time can be significantly improved. Therefore, such a device can be mass-produced with low cost.

First Embodiment

Hereinafter, a nitride semiconductor laser device according to a first illustrative embodiment will be described with reference to the accompanying drawings.

Figure 1:
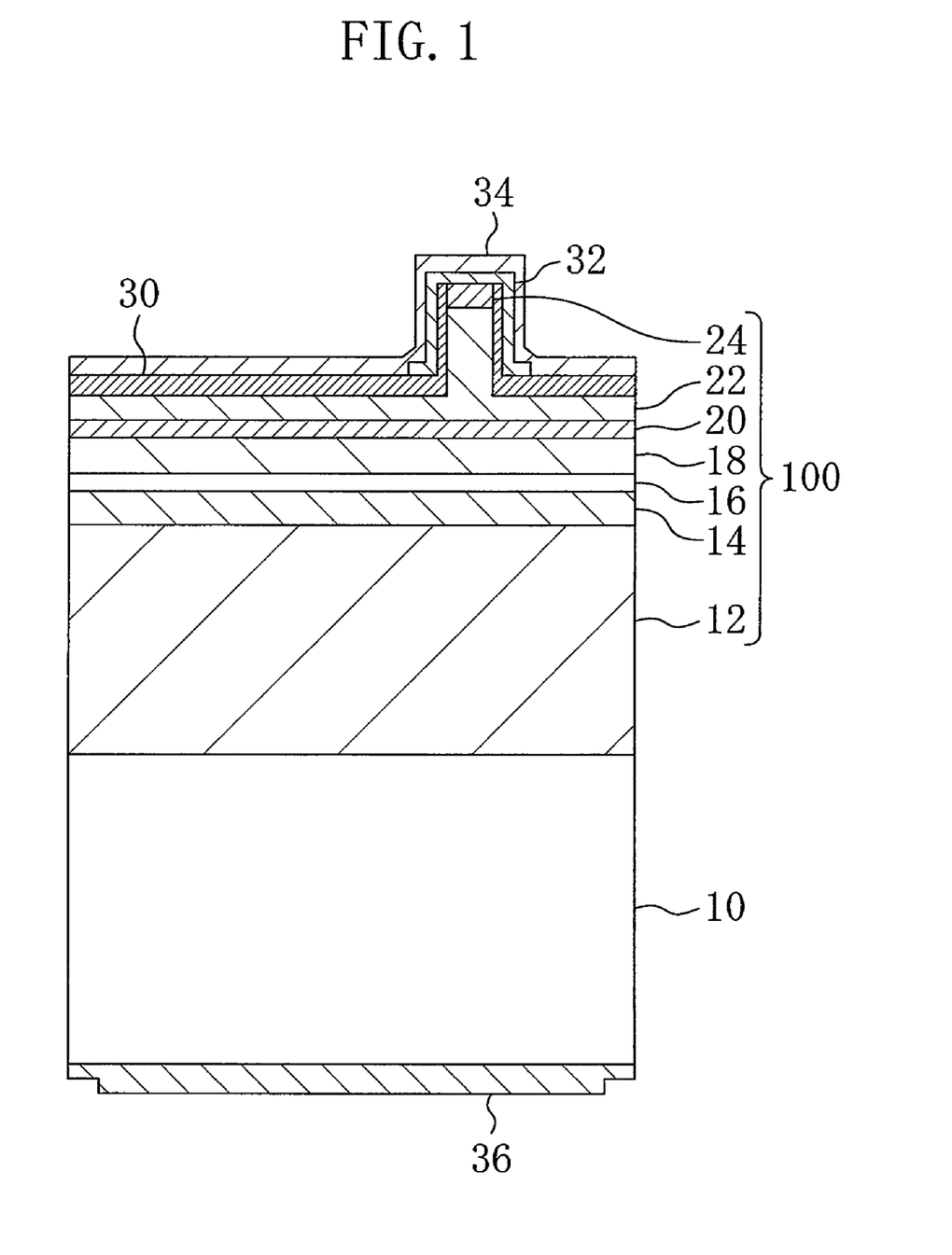
FIG. 1 is a cross-sectional view schematically showing a structure of a nitride semiconductor laser device according to a first illustrative embodiment, taken along a direction parallel to a cavity facet thereof.

FIG. 1 is a cross-sectional view schematically showing a structure of a GaN-based semiconductor laser device according to the first illustrative embodiment, taken along a direction parallel to a cavity facet thereof.

The semiconductor laser device of the first embodiment includes an n-type substrate 10 made of n-type GaN having a thickness of about 80 nm and doped with an n-type impurity silicon (Si) having a concentration of about $1\times10^{18}$ cm$^{-3}$, and a multilayer structure 100 made of a GaN-based semiconductor formed on a main surface (Ga surface) of the n-type substrate 10.

The multilayer structure 100 includes an n-type cladding layer 12 made of n-type AlGaN, an optical waveguide layer 14 made of n-type GaN, a multiple-quantum well active layer (light emitting layer) 16 made of InGaN, an intermediate layer 18 made of InGaN, a cap layer 20 made of p-type AlGaN, a p-type cladding layer 22 made of p-type AlGaN, and a contact layer 24 made of p-type GaN. These layers are successively epitaxially grown on the n-type substrate 10.

Table 1 shows impurity concentrations (dopant concentrations) and thicknesses of the semiconductor layers included in the multilayer structure 100.

TABLE 1

| Semiconductor layer | Impurity concentration (cm$^{-3}$) | Thickness |
|---|---|---|
| n-type AlGaN cladding layer 12 | Si: $5 \times 10^{17}$ | 2.5 μm |
| n-type GaN optical waveguide layer 14 | Si: $5 \times 10^{17}$ | 160 nm |
| InGaN multiple-quantum well active layer 16 | | active layer (6 nm)/ barrier layer (12 nm) |
| InGaN intermediate layer 18 | | 75 nm |
| p-type AlGaN cap layer 20 | Mg: $1 \times 10^{19}$ | 15 nm |
| p-type AlGaN cladding layer 22 | Mg: $1 \times 10^{19}$ | 0.5 μm |
| p-type GaN contact layer 24 | Mg: $1 \times 10^{20}$ | 0.1 μm |

Note that the impurities, impurity concentrations and thicknesses of the semiconductor layers shown in Table 1 are only for illustrative purposes, and the present disclosure is not limited to these. The intermediate layer 18 may include multiple layers having different In mole fractions. In this case, a layer closer to the active layer preferably has a larger In mole fraction.

In the multilayer structure 100, upper portions of the contact layer 24 and the p-type cladding layer 22 are shaped into a ridge stripe extending in a cavity length direction. The ridge stripe has a width of, for example, about 1.4 μm, and a cavity length of, for example, about 800 μm. Also, a chip width (a width in a direction perpendicular to the cavity) is, for example, 150 μm.

An entire upper surface of the multilayer structure 100 is covered with an insulating film 30, except for an upper surface of the ridge stripe. The insulating film 30 has a stripe-shaped opening which exposes the upper surface of the ridge stripe, i.e., the contact layer 24.

The upper surface and side surfaces of the ridge stripe are covered with a positive contact electrode 32, whereby an upper surface of the contact layer 24 is connected via the opening of the insulating film 30 to the positive contact electrode 32. Moreover, a positive wiring electrode (Ti/Pt/Au) 34 is formed, covering upper surfaces of the positive contact electrode 32 and the insulating film 30. Here, for example, the positive contact electrode 32 is formed of a multilayer film of palladium (Pd) and platinum (Pt), and the positive wiring electrode 34 is formed of a multilayer film of titanium (Ti), platinum (Pt) and gold (Au).

A negative electrode made of, for example, titanium (Ti), platinum (Pt) and gold (Au) is formed on a surface (rear surface) opposite to the multilayer structure 100 of the n-type substrate 10.

Hereafter, a preferable embodiment of a method for fabricating the nitride semiconductor laser device of the first illustrative embodiment will be described.

Initially, the n-type substrate 10 made of n-type GaN which has been fabricated by a known technique is prepared. The n-type substrate 10 has a thickness of, for example, about 300 μm and has a main surface which has been subjected to planarization by polishing.

Next, the multilayer structure 100 is formed on the main surface of the n-type substrate 10.

Initially, the n-type substrate 10 is placed in a chamber of a Metal-Organic Vapor Phase Expitaxy (MOVPE) apparatus. Thereafter, the main surface of the n-type substrate 10 is subjected to thermal processing (thermal cleaning) at a temperature of about 500° C. to about 1100° C. This thermal processing is performed at, for example, 800° C. for one minute or more, preferably five minutes or more. During the thermal processing, gas containing nitrogen atoms (N) (e.g., nitrogen (N$_2$), ammonia (NH$_3$), hydrazine (N$_2$H$_4$), etc.) is preferably caused to flow through the chamber.

Next, a temperature in the chamber is controlled to about 1000° C. Material gases (trimethylgallium (TMG) as a Ga source, trimethylaluminum (TMA) as an Al source, and ammonia (NH$_3$) as a N source) and carrier gases (hydrogen (H$_2$) and nitrogen (N$_2$)) are supplied onto the n-type substrate 10. Moreover, silane (SiH$_4$) gas is supplied as an n-type dopant. As a result, the n-type cladding layer 12 made of Al$_{0.04}$Ga$_{0.96}$N having a thickness of about 2.5 μm and a Si impurity concentration of about $5\times10^{17}$ cm$^{-3}$ is grown. Thereafter, the optical waveguide layer 14 made of n-type GaN having a thickness of about 160 nm and a Si impurity concentration of about $5\times10^{17}$ cm$^{-3}$ is grown on the n-type cladding layer 12. Thereafter, the growth temperature is decreased to about 800° C., and trimethylindium (TMI) and TMG are then supplied using nitrogen as carrier gas, which replaces hydrogen, thereby growing the multiple-quantum well active layer 16 including quantum well layers (two layers) each made of In$_{0.1}$Ga$_{0.9}$N having a film thickness of about 6 nm and a barrier layer (single layer) made of In$_{0.02}$Ga$_{0.98}$N having a film thickness of about 12 nm. Thereafter, the intermediate layer 18 made of In$_{0.01}$Ga$_{0.99}$N is grown on the multiple-quantum well active layer 16. The intermediate layer 18 significantly suppresses diffusion of a p-type dopant (Mg) from a p-type semiconductor layer which will be formed thereon to the multiple-quantum well active layer 16. As a result, the quality of the multiple-quantum well active layer 16 can be maintained high even after the crystal growth.

Next, the temperature in the chamber is increased back to about 1000° C. The cap layer 20 made of p-type $Al_{0.20}Ga_{0.80}N$ having a film thickness of about 15 μm and a Mg impurity concentration of about $1\times10^{19}$ cm$^{-3}$ is grown on the intermediate layer 18 while supplying bis(cyclopentadienyl)magnesium ($Cp_2Mg$) gas as a p-type dopant, where hydrogen is additionally introduced as carrier gas.

Next, the p-type cladding layer 22 made of p-type $Al_{0.04}Ga_{0.96}N$ having a thickness of about 0.5 μm and a Mg impurity concentration of about $1\times10^{19}$ cm$^{-3}$ is grown on the cap layer 20. Next, the contact layer 24 made of p-type GaN having a thickness of about 0.1 μm and a Mg impurity concentration of about $1\times10^{20}$ cm$^{-3}$ is grown on the p-type cladding layer 22. Thus, the multilayer structure 100 including a plurality of GaN-based semiconductor layers is obtained.

Next, a process of forming the positive contact electrode 32 on an upper surface of the multilayer structure 100 will be described.

Initially, a mask forming film (not shown) is deposited on an upper surface of the multilayer structure using a plasma CVD apparatus or the like. The mask forming film is made of a material, such as $SiO_2$ or the like, which is highly resistant to dry etching so as to serve as a mask during dry etching of the multilayer structure 100. Thereafter, the mask forming film is shaped into a stripe having a width of 1.4 μm by lithography and wet etching using hydrogen fluoride (HF), thereby forming a mask film. Next, the stripe-shaped mask film is used to shape upper portions of the contact layer 24 and the p-type cladding layer 22 into a ridge using a dry etching apparatus. Thereafter, the mask film is removed using hydrogen fluoride.

Next, the insulating film 30 is deposited on the ridge-shaped multilayer structure 100, followed by lithography and wet etching using hydrogen fluoride to remove only an upper portion of the ridge of the insulating film 30. In this case, a lower portion of the insulating film 30 which contacts an exposed surface of the multilayer structure 100 may be made of $SiO_2$, which has a high insulating property, and an upper portion thereof may be made of a multilayer film of, for example, titanium dioxide ($TiO_2$), which has a light absorption action with respect to laser light, and titanium nitride (TiN). With the insulating film 30 having such a multilayer structure, an improvement in electrical insulation suppresses the reactive current, so that the threshold of an injected current is lowered, and the shape of a Far Field Pattern (FFP), particularly the shape of a far field pattern in a direction parallel to the substrate surface, is improved.

Thereafter, Pd and Pt are successively vapor-deposited on an upper surface and side surfaces of the ridge and regions lateral to the ridge by lithography and a lift-off technique for a resist, thereby selectively forming the positive contact electrode 32. Next, Ti, Pt and Au are successively vapor-deposited to cover the positive contact electrode 32 and the insulating film 30, thereby forming the positive wiring electrode 34.

Next, wires (not shown) made of gold (Au) for supplying a current are connected onto the positive wiring electrode 34 by a ball bonder or the like. Note that if the wires are connected to the positive wiring electrode 34 in regions lateral to the ridges of the positive wiring electrode 34, damage during connection of the wires by the ball bonder is prevented from directly affecting an upper portion of the ridge which is a substantial current supply path to the multilayer structure 100. Therefore, the multiple-quantum well active layer 16 is less damaged. As a result, a semiconductor laser device having excellent reliability can be fabricated.

Next, the rear surface of the n-type substrate 10 is polished to reduce the thickness of the n-type substrate 10 to about 80 μm.

Next, the polished surface of the n-type substrate 10 is cleaned by wet etching, dry etching or the like. Thereafter, metal films of Ti, Pt and Au are successively deposited on the cleaned rear surface of the n-type substrate 10 in this stated order from the substrate, thereby forming a negative electrode 36. Moreover, only the Au film (uppermost layer) of the negative electrode 36 which is positioned on a cleavage (first cleavage and second cleavage) region of the n-type substrate 10 is selectively removed by wet etching. This is because if the Au film is left, the high viscosity of the Au film hinders satisfactory cleavage. Therefore, by performing first cleavage and second cleavage in the region from which the Au film has been selectively removed, the rate of success of cleavage can be improved. Thereafter, a cavity facet is formed by performing first cleavage along an M-plane of GaN of the n-type substrate 10 using a scriber and a breaker.

Next, a facet protective film is formed on the cavity facet thus formed.

Specifically, a laser bar obtained by the first cleavage is placed in an ECR apparatus. After evacuation, a facet protective film made of a dielectric material is deposited on the cavity facet. Here, in the ECR apparatus, before the facet protective film is formed, plasma cleaning may be performed using argon (Ar) gas so as to remove contaminants from the cavity facet. Note that the plasma cleaning may be performed using a combination of Ar gas and nitrogen ($N_2$) gas instead of only Ar gas.

Figure 2:
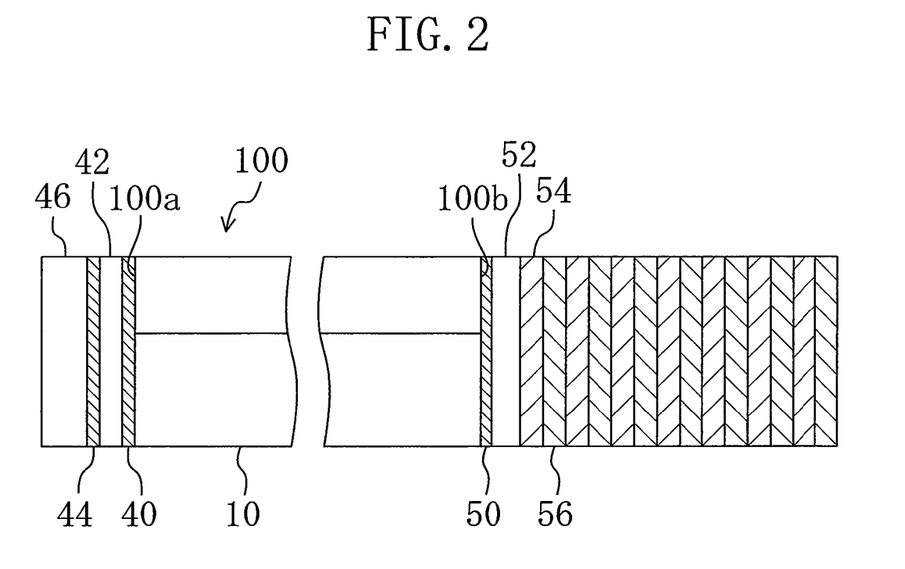
FIG. 2 is a cross-sectional view schematically showing the structure of the nitride semiconductor laser device of the first illustrative embodiment, taken along a direction parallel to a cavity length direction.

Hereinafter, a method for forming a facet protective film on an emitting facet according to this embodiment will be described in detail with reference to FIG. 2. FIG. 2 is a cross-sectional view taken along a direction parallel to the cavity length direction. In FIG. 2, the insulating film 30, the electrodes and the like are not shown for the sake of simplicity.

As shown in FIG. 2, an emitting facet 100a is subjected to the aforementioned ECR plasma cleaning. Thereafter, Ar gas and $N_2$ gas are introduced into a target chamber, in which plasma is then generated. Here, by applying a predetermined bias voltage to a target material made of aluminum (Al), an AlN film having a film thickness of about 6 nm is deposited as a first protective film 40 contacting the emitting facet 100a.

Next, Ar gas and $O_2$ gas are introduced into the target chamber, in which plasma is then generated. Here, by applying a predetermined bias voltage to the Al target material, an $Al_2O_3$ film having a film thickness of about 60 nm is deposited as a second protective film 42 on the first protective film 40. Next, Ar gas and $N_2$ gas are introduced to deposit an AlN film having a film thickness of about 6 nm as a third protective film 44 on the second protective film 42. Next, Ar gas and $O_2$ gas are introduced to deposit an $Al_2O_3$ film having a film thickness of about 100 nm as a fourth protective film 46 (final protective film) on the third protective film 44. Note that the reflectance of the emitting facet 100a can be controlled by the film thicknesses of the $Al_2O_3$ films. In this embodiment, the reflectance of the emitting facet 100a with respect to laser light is set to about 18%. Note that the fourth protective film 46 may be made of aluminum oxynitride (AlON).

Next, a reflective film which is provided on a reflective facet 100b will be described.

The reflective facet 100b is subjected to the aforementioned ECR plasma cleaning, and thereafter, an AlN film having a film thickness of about 6 nm is deposited as a first rear protective film 50 contacting the reflective facet 100b. Next, an $Al_2O_3$ film having a film thickness of about 60 nm is deposited as a second rear protective film 52. Next, the Al target material is replaced, and a reflective film is formed which is a multilayer film including seven pairs of a silicon dioxide ($SiO_2$) film 54 and a zirconium dioxide ($ZrO_2$) 56. In the first embodiment, the $SiO_2$ films and the $ZrO_2$ films are arranged in this order, and film thicknesses thereof are adjusted to achieve a reflectance of 90% or more with respect to laser light.

Thereafter, laser bars obtained by the first cleavage are subjected to second cleavage, thereby obtaining individual laser chips.

Next, a laser chip mounting process will be described.

Specifically, the laser chip is automatically mounted onto a submount and a stem made of aluminum nitride (AlN) or the like using a solder material.

Next, Au wires for supplying a current are connected to the positive wiring electrode 34, and a wiring electrode of the submount electrically connected to the negative electrode 36. Next, a cap having a glass window for emitting laser light is fusion-bonded to a stem using a high electric field press so as to hermetically seal the laser chip.

When a current was passed, at room temperature, through a laser device 1 which had been fabricated according to the first embodiment, the threshold current was 30 mA, Continuous Wave (CW) oscillation was achieved, the slope efficiency was 1.5 W/A, and the oscillation wavelength was 405 nm. Also, an aging test was conducted by continuously driving the laser device 1 at high temperature and high power (75° C., 160 mW). As a result, the laser device 1 operated stably for 1000 hours or more.

Figure 3:
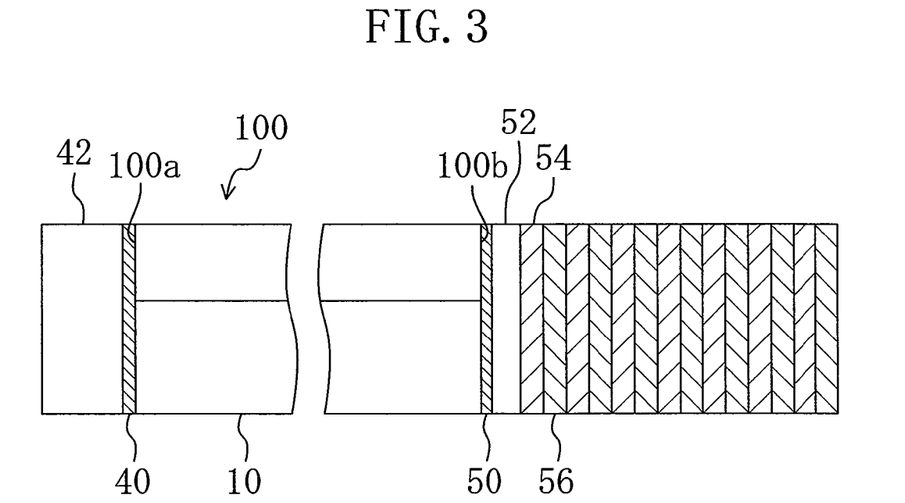
FIG. 3 is a cross-sectional view schematically showing a structure of a comparative nitride semiconductor laser device, taken along a direction parallel to a cavity length direction.

On the other hand, in order to verify an effect of the third protective film 44 for the emitting facet 100a, a laser device 2 was prepared which is the same as the laser device 1, except that the third protective film 44 is not provided. The laser devices 1 and 2 were studied in comparison with each other. FIG. 3 is a cross-sectional view of a structure of the laser device 2. When a current was passed through the laser device 2 at room temperature, the laser device 2 exhibited initial characteristics similar to those of the laser device 1. When an aging test was conducted under the same conditions, the laser device 2 was destroyed within 1000 hours at a rate of about 10%.

Figure 4:
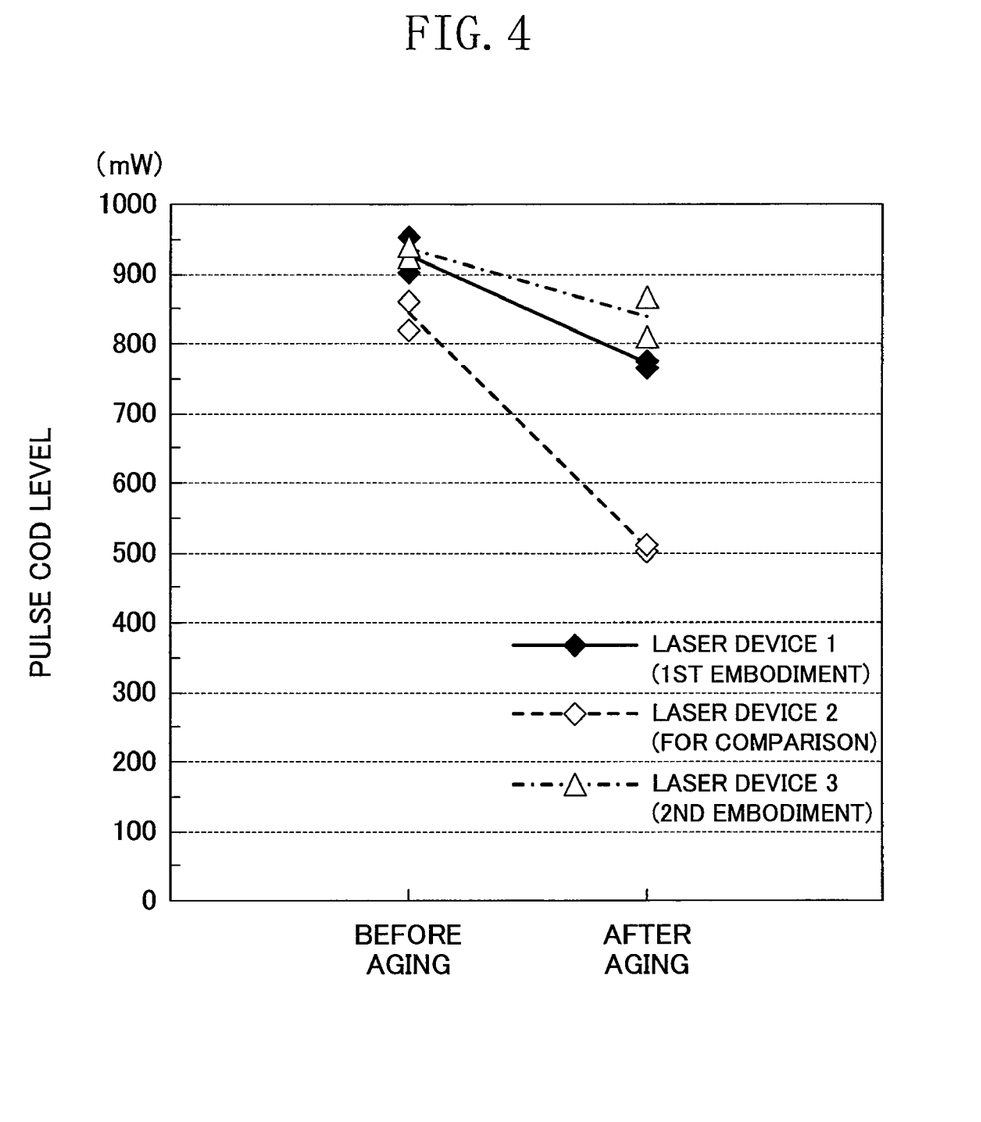
FIG. 4 is a graph showing a result of evaluation of COD levels before and after an aging test of the nitride semiconductor laser devices of the first and second illustrative embodiments and the comparative nitride semiconductor laser device.

This phenomenon was studied by investigating the laser devices 1 and 2 in terms of changes in their COD levels in the aging test. Specifically, the COD levels were evaluated before and after the aging test (here, the duration of the aging test was 300 hours). The result of evaluation is shown in FIG. 4. Note that the COD level refers to a maximum light output at which a laser oscillation stops when a laser device is driven by passage of a pulse current (duty: 50%). As can be seen from FIG. 4, the COD level of the laser device 1 was reduced from about 925 mW (before the aging test) to about 770 mW (after the aging test). On the other hand, the comparative laser device 2 was reduced from about 840 mW to about 505 mW. Whereas the initial COD level of the laser device 2 is not much different from that of the laser device 1 before the aging test, a reduction in the COD level of the laser device 2 after the aging test is clearly larger than that of the laser device 1.

Hereinafter, an effect of the third protective film 44 will be described in detail based on an analysis of the laser devices 1 and 2 when they are damaged.

Additional Experiment of First Embodiment

The laser device 1 of this embodiment and the comparative laser device 2 which had been damaged after a 300-hour aging test were examined using a Transmission Electron Microscope (TEM) in terms of a damaged state of the emitting facet 100a. Note that the TEM observation was conducted in a direction parallel to the ridge stripe, including the protective films and the cavity facet. The examination revealed that, in the laser device 2, whereas there was not a change in the first protective film 40 (AlN film), crystallization was promoted in the vicinity of the active layer 16 in the second protective film 42 ($Al_2O_3$ film) provided on the first protective film 40. The crystallization may be an alteration of the amorphous $Al_2O_3$ film deposited by the ECR sputtering technique, which is caused by a large amount of heat locally generated by a high density of light in the vicinity of the active layer 16.

By contrast, in the laser device 1 of this embodiment additionally including the third protective film 44, an alteration of the second protective film 42 ($Al_2O_3$ film) was not observed. This may be because the second protective film 42 (amorphous $Al_2O_3$ film) is sandwiched between the AlN films having high thermal conductivity (the first protective film 40 and the third protective film 44), and therefore, locally generated heat is rapidly dissipated.

Moreover, the laser devices 1 and 2 were examined and compared in terms of oxidation of the emitting facet 100a by Auger Electron Spectroscopy (AES). The amount of oxygen between the emitting facet 100a and the first protective film 40 was smaller in the laser device 1 than in the laser device 2. This may be because the presence of the third protective film 44 (AlN film) in the laser device 1 provides the following two effects:

1) the alteration of the second protective film 42 ($Al_2O_3$ film) is suppressed, so that the diffusion of oxygen due to the alteration is suppressed; and 2) the third protective film 44 (AlN film) interrupts oxygen diffusing through the fourth protective film 46 ($Al_2O_3$ film) from ambient air.

According to the additional experiments and the resultant reliability above, the presence of the AlN film 44 with an $Al_2O_3$ film being interposed between the AlN film 44 and the first protective film 40 contacting the emitting facet 100a of the cavity significantly suppresses the deterioration of the emitting facet 100a due to oxidation. As a result, the long-term reliability during a high-power operation of the GaN-based semiconductor laser device can be significantly improved, thereby making it possible to fabricate the laser device with high yield.

Second Embodiment

Hereinafter, a nitride semiconductor laser device according to a second illustrative embodiment will be described with reference to the drawings.

Figure 5:
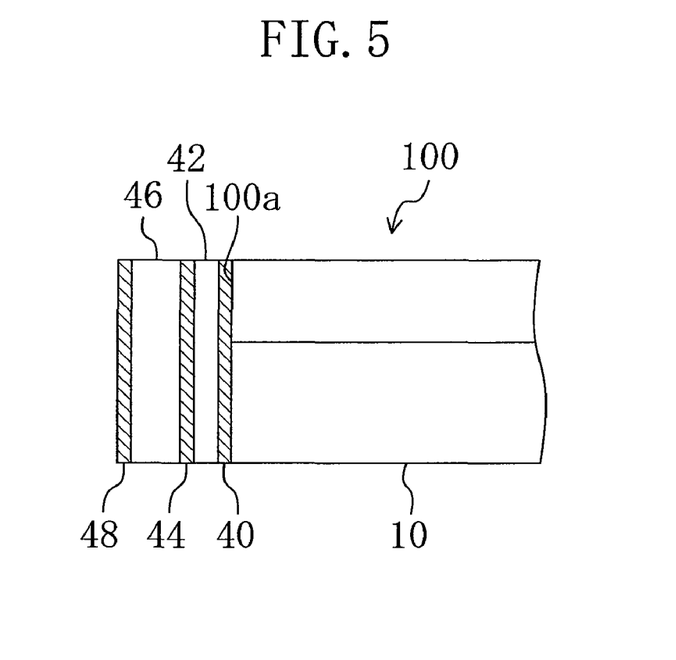
FIG. 5 is a cross-sectional view schematically showing a structure of a nitride semiconductor laser device according to a second illustrative embodiment, taken along a direction parallel to a cavity length direction.

FIG. 5 is a cross-sectional view schematically showing a structure of a GaN-based semiconductor laser device according to the second illustrative embodiment, taken along a direction parallel to a cavity length direction.

As shown in FIG. 5, the second embodiment is characterized in that an AlN film is provided as a fifth protective film 48 on the fourth protective film 46 for the emitting facet 100a in the semiconductor laser device of the first embodiment.

Specifically, the fifth protective film 48 made of AlN having a film thickness of about 6 nm is deposited on a surface opposite to the third protective film 44 of the fourth protective film 46.

When a current was passed, at room temperature, through a laser device 3 which had been fabricated according to the second embodiment, Continuous Wave (CW) oscillation was achieved, and its characteristics were substantially the same as those of the laser device 1 of the first embodiment. A change in the COD level before and after an aging test was also investigated as in the first embodiment. As a result, the COD level was reduced from about 930 mW to about 840 mW, which was a smaller reduction in COD than that of the laser device 1 as shown in FIG. 4. Thus, COD was more significantly reduced than in the laser device 1. The laser device 3 is different from the laser device 1 in that the laser device 3 includes an AlN film as a final protective film for the emitting facet 100a, which may exhibit the following two effects:

1) the presence of the AlN film having high heat dissipating capability on the fourth protective film 46 suppresses the alteration of the fourth protective film 46 made of $Al_2O_3$, which otherwise occurs in the fourth protective film 46 (final protective film) in the laser device 1 since heat is less dissipated in a region thereof contacting ambient air; and 2) the fifth protective film 48 (AlN film) interrupts oxygen diffusing through the fourth protective film 46 ($Al_2O_3$ film) from ambient air.

According to the resultant reliability above, the presence of the AlN film 44 with an $Al_2O_3$ film being interposed between the AlN film 44 and the first protective film 40 contacting the emitting facet 100a significantly suppresses the deterioration of the emitting facet 100a due to oxidation. As a result, the long-term reliability during a high-power operation of the GaN-based semiconductor laser device can be significantly improved, thereby making it possible to fabricate the laser device with high yield.

Third Embodiment

Hereinafter, a nitride semiconductor laser device according to a third illustrative embodiment will be described with reference to the drawings.

Figure 6:
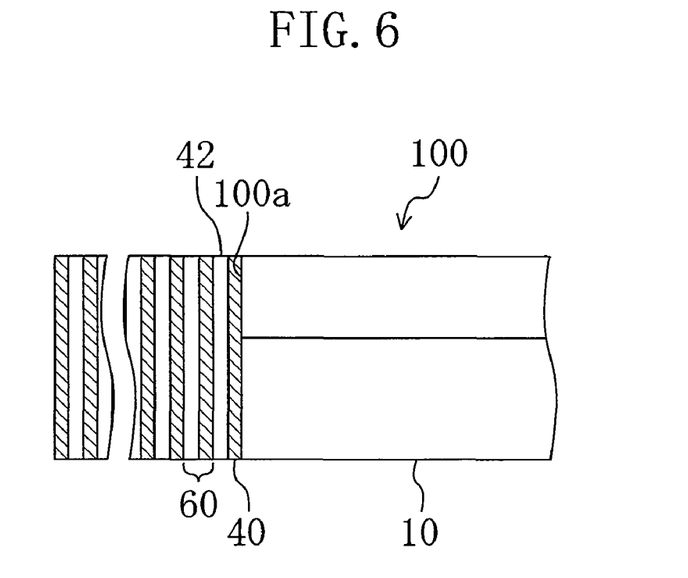
FIG. 6 is a cross-sectional view schematically showing a structure of a nitride semiconductor laser device according to a third illustrative embodiment, taken along a direction parallel to a cavity length direction.

FIG. 6 is a cross-sectional view schematically showing a structure of a GaN-based semiconductor laser device according to the third illustrative embodiment, taken along a direction parallel to a cavity length direction.

As shown in FIG. 6, the third embodiment is characterized in that a first protective film 40 contacting an emitting facet 100a is an AlN film, and periodic layers 60 each made of an $Al_2O_3$ film and an AlN film are deposited on the AlN film.

Specifically, an AlN film having a film thickness of about 6 nm is deposited as the first protective film 40 on the emitting facet 100a by an ECR sputtering technique as in the first embodiment. Next, a plurality of periodic layers 60 each of which is a pair of an $Al_2O_3$ film having a film thickness of about 10 nm and an AlN film having a film thickness of about 6 nm, are deposited on the first protective film 40 so that a reflectance thereof becomes about 18%.

When a current was passed, at room temperature, through a laser device 4 which had been fabricated according to the third embodiment, Continuous Wave (CW) oscillation was achieved, and its characteristics were substantially the same as those of the laser device 1 of the first embodiment. A change in the COD level before and after an aging test was also investigated as in the first embodiment. The resultant COD level was similar to that of the laser device 3. Thus, COD was more significantly reduced than in the laser device 1.

This may be because a plurality of AlN films are periodically provided between $Al_2O_3$ films, and the resultant whole facet protective film improves heat dissipating capability. In addition, this may be because a plurality of AlN thin films each having a film thickness of about 6 nm has a smaller stress on the emitting facet 100a than that of a single AlN film having substantially the same film thickness, and therefore, the peeling off of the facet protective film from the emitting facet 100a is suppressed.

Fourth Embodiment

Hereinafter, a nitride semiconductor laser device according to a fourth illustrative embodiment will be described.

The fourth embodiment is characterized in that an aluminum oxynitride (AlON) film is used as the second protective film 42 for the emitting facet 100a instead of an $Al_2O_3$ film in the first to third embodiments.

Specifically, the second protective film 42 made of an AlON film can be deposited by introducing oxygen ($O_2$) gas along with Ar gas and $N_2$ gas into a target chamber of an ECR apparatus in which an Al target material is attached. As compared to the $Al_2O_3$ film, the AlON film has high thermal conductivity, and has high crystallization temperature and therefore are thermally stable. Therefore, in the laser device of each embodiment, the COD level after an aging test tended to be improved by about 10% to about 20%.

Fifth Embodiment

Hereinafter, a nitride semiconductor laser device according to a fifth illustrative embodiment will be described.

The fifth embodiment is characterized in that a silicon dioxide ($SiO_2$) film or a silicon oxynitride (SiON) film is used as the second protective film 42 for the emitting facet 100a instead of an $Al_2O_3$ film in the first to third embodiments.

As compared to the $Al_2O_3$ film, the $SiO_2$ or SiON film has low thermal conductivity, and has high crystallization temperature and therefore are thermally stable. Therefore, in the laser device of each embodiment, the COD level after an aging test tended to be improved by about 5% to about 15%.

Sixth Embodiment

Hereinafter, a nitride semiconductor laser device according to a sixth illustrative embodiment will be described.

The sixth embodiment is characterized in that the silicon (Si) concentration of the first protective film 40 (AlN film) is set to be higher than that of the third protective film 44 (AlN film) for the emitting facet 100a of the first embodiment.

In order to increase the Si concentration of the first protective film 40 (AlN film), silicon (Si)-containing gas, such as silane ($SiH_4$) gas or the like, is introduced into ECR gas to add a small amount of Si when the AlN film is deposited by an ECR apparatus.

When a current was passed, at room temperature, through a laser device 5 which had been fabricated according to the sixth embodiment, Continuous Wave (CW) oscillation was achieved, and its characteristics were substantially the same as those of the laser device 1 of the first embodiment. A change in the COD level before and after an aging test was also investigated as in the first embodiment. The resultant COD level was reduced from about 925 mW to about 795 mW. Thus, the COD level was further improved than in the laser device 1.

This may be because Si is introduced into the first protective film 40 (AlN film) contacting the emitting facet 100a, and moreover, the Si concentration is increased, so that the bond strength between the AlN film and the emitting facet 100a is increased to a covalent bond level, and therefore, the peeling off of the facet protective film due to aging is suppressed.

Note that the Si concentration of the first protective film (AlN film) of the sixth embodiment is preferably about $1\times10^{10}$ cm$^{-3}$ to about $3\times10^{20}$ cm$^{-3}$.

It has been assumed in the sixth embodiment above that Si is introduced into the first protective film 40 by introducing gas containing a small amount of Si during ECR sputtering. Alternatively, Si may be introduced in a preprocess immediately before the facet protective film is deposited on the emitting facet 100a, or the concentration of Si introduced into the n-type semiconductor layer of the multilayer structure 100 may be increased. In either case, a similar effect can be obtained.

An effect of the sixth embodiment is not limited to the structure of the first embodiment, and may be obtained in the structures of the other embodiments.

As described above, the nitride semiconductor laser device of each embodiment can have a significantly improved long-term reliability during a high-power operation, and therefore, is useful as a nitride semiconductor laser device in which a protective film is provided for a cavity facet, and the like.

What is claimed is:

1. A nitride semiconductor laser device comprising:
   a multilayer structure including a plurality of nitride semiconductor layers including a light emitting layer, the multilayer structure having cavity facets facing each other; and
   a plurality of protective films made of a dielectric material provided on one of the cavity facets,
   wherein the plurality of protective films include a first protective film, a second protective film and a third protective film,
   the first protective film contacts the cavity facet and is made of aluminum nitride,
   the second protective film is provided on a surface opposite to the cavity facet of the first protective film and is made of a material different from that of the first protective film,
   the third protective film is provided on a surface opposite to the first protective film of the second protective film and is made of the same material as that of the first protective film,
   the first and third protective films contain silicon, and
   the first protective film has a higher silicon concentration than that of the third protective film.

2. The nitride semiconductor laser device of claim 1, wherein
   the plurality of protective films include a fourth protective film provided on a surface opposite to the second protective film of the third protective film, and
   the fourth protective film is made of aluminum oxide or aluminum oxynitride.

3. The nitride semiconductor laser device of claim 2, wherein
   the plurality of protective films include a fifth protective film provided on a surface opposite to the third protective film of the fourth protective film, and
   the fifth protective film is made of the same material as that of the first protective film.

4. The nitride semiconductor laser device of claim 1, wherein the second protective film is made of aluminum oxide, aluminum oxynitride, silicon oxide or silicon oxynitride.

* * * * *